(12) United States Patent
Chen et al.

(10) Patent No.: US 10,008,568 B2
(45) Date of Patent: Jun. 26, 2018

(54) STRUCTURE AND FORMATION METHOD OF SEMICONDUCTOR DEVICE STRUCTURE

(71) Applicant: Taiwan Semiconductor Manufacturing Co., Ltd, Hsin-Chu (TW)

(72) Inventors: Lung Chen, Hsinchu (TW); Kang-Min Kuo, Zhubei (TW); Wen-Hsin Chan, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days. days.

(21) Appl. No.: 14/704,324

(22) Filed: May 5, 2015

(65) Prior Publication Data

US 2016/0293702 A1    Oct. 6, 2016

Related U.S. Application Data

(60) Provisional application No. 62/140,241, filed on Mar. 30, 2015.

(51) Int. Cl.
| | |
|---|---|
| *H01L 29/08* | (2006.01) |
| *H01L 29/78* | (2006.01) |
| *H01L 29/66* | (2006.01) |
| *H01L 29/165* | (2006.01) |
| *H01L 29/161* | (2006.01) |

(52) U.S. Cl.
CPC .... *H01L 29/0847* (2013.01); *H01L 29/66628* (2013.01); *H01L 29/66636* (2013.01); *H01L 29/7834* (2013.01); *H01L 29/7848* (2013.01); *H01L 29/161* (2013.01); *H01L 29/165* (2013.01)

(58) Field of Classification Search
CPC .................................................. H01L 29/0847
See application file for complete search history.

(56) References Cited

U.S. PATENT DOCUMENTS

| | | | |
|---|---|---|---|
| 6,621,131 B2 * | 9/2003 | Murthy | H01L 29/1054 257/192 |
| 8,404,550 B2 | 3/2013 | Scheiper et al. | |
| 2007/0190787 A1 * | 8/2007 | Loubet | H01L 21/3065 438/689 |

(Continued)

FOREIGN PATENT DOCUMENTS

| | | |
|---|---|---|
| DE | 102008035806 B4 | 6/2010 |
| DE | 112007002306 B4 | 9/2011 |

(Continued)

*Primary Examiner* — Su C Kim
*Assistant Examiner* — David S Wilbert
(74) *Attorney, Agent, or Firm* — Haynes and Boone, LLP

(57) ABSTRACT

Structures and formation methods of a semiconductor device structure are provided. The semiconductor device structure includes a gate stack over a semiconductor substrate. The semiconductor device structure also includes a source/drain structure over the semiconductor substrate, and the source/drain structure includes a dopant. The semiconductor device structure further includes a channel region under the gate stack. In addition, the semiconductor device structure includes a semiconductor layer surrounding the source/drain structure. The semiconductor layer is configured to prevent the dopant from entering the channel region.

20 Claims, 9 Drawing Sheets

(56) References Cited

U.S. PATENT DOCUMENTS

| | | | |
|---|---|---|---|
| 2007/0254421 A1* | 11/2007 | Tsai | H01L 29/6656 438/197 |
| 2008/0079033 A1 | 4/2008 | Waite et al. | |
| 2008/0124878 A1* | 5/2008 | Cook | H01L 29/66621 438/300 |
| 2008/0157119 A1* | 7/2008 | Tsai | H01L 29/165 257/190 |
| 2010/0025743 A1 | 2/2010 | Hoentschel et al. | |
| 2010/0301350 A1 | 12/2010 | Tamura et al. | |
| 2011/0256681 A1* | 10/2011 | Lin | H01L 29/665 438/285 |
| 2012/0083076 A1* | 4/2012 | Wang | H01L 21/28194 438/151 |
| 2012/0181549 A1 | 7/2012 | Johnson et al. | |
| 2013/0207166 A1 | 8/2013 | Chen et al. | |
| 2013/0248948 A1* | 9/2013 | Ma | H01L 29/66636 257/288 |
| 2013/0280875 A1 | 10/2013 | Cheng et al. | |
| 2014/0353732 A1* | 12/2014 | Adam | H01L 29/66492 257/288 |
| 2015/0372143 A1* | 12/2015 | Bae | H01L 29/7851 257/401 |

FOREIGN PATENT DOCUMENTS

| | | |
|---|---|---|
| DE | 102009047304 B4 | 4/2012 |
| DE | 112012000510 T5 | 12/2013 |
| WO | WO-2009093328 | 7/2009 |

* cited by examiner

STRUCTURE AND FORMATION METHOD OF SEMICONDUCTOR DEVICE STRUCTURE

PRIORITY CLAIM AND CROSS-REFERENCE

This application claims the benefit of U.S. Provisional Application No. 62/140,241, filed on Mar. 30, 2015, the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
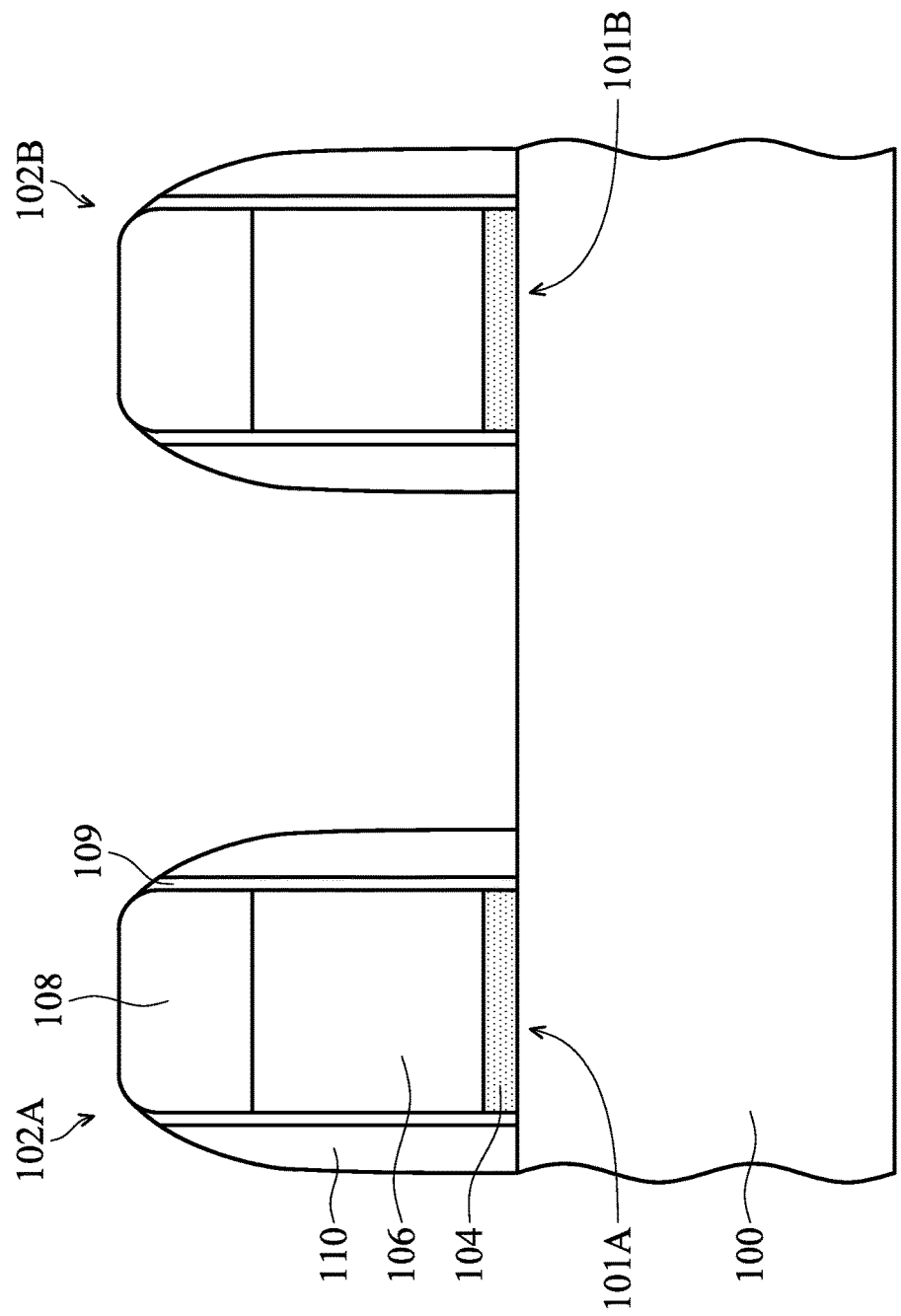
FIGS. 1A-1G are cross-sectional views of various stages of a process for forming a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. FIGS. 1A-1G are cross-sectional views of various stages of a process for forming a semiconductor device structure, in accordance with some embodiments. Additional operations can be provided before, during, and/or after the stages described in FIGS. 1A-1G. Some of the stages that are described can be replaced or eliminated for different embodiments. Additional features can be added to the semiconductor device structure. Some of the features described below can be replaced or eliminated for different embodiments.

As shown in FIG. 1A, a semiconductor substrate 100 is provided. In some embodiments, the semiconductor substrate 100 is a bulk semiconductor substrate, such as a semiconductor wafer. For example, the semiconductor substrate 100 is a silicon wafer. The semiconductor substrate 100 may include silicon or other elementary semiconductor materials such as germanium. In some other embodiments, the semiconductor substrate 100 includes a compound semiconductor. The compound semiconductor may include gallium arsenide, silicon carbide, indium arsenide, indium phosphide, another suitable compound semiconductor, or a combination thereof.

In some embodiments, the semiconductor substrate 100 includes a semiconductor-on-insulator (SOI) substrate. The SOI substrate may be fabricated using a separation by implantation of oxygen (SIMOX) process, a wafer bonding process, another applicable method, or a combination thereof. In some embodiments, the semiconductor substrate 100 includes a fin structure. The fin structure may include multiple fins. In some embodiments, the structure shown in FIG. 1A is a portion of one of the fins.

In some embodiments, isolation features (not shown) are formed in the semiconductor substrate 100. The isolation features are used to define and/or electrically isolate various device elements formed in and/or over the semiconductor substrate 100. In some embodiments, the isolation features include shallow trench isolation (STI) features, local oxidation of silicon (LOCOS) features, another suitable isolation feature, or a combination thereof. In some embodiments, the isolation features are made of a dielectric material. The dielectric material may include silicon oxide, silicon nitride, silicon oxynitride, fluoride-doped silicate glass (FSG), low-K dielectric material, another suitable material, or a combination thereof.

As shown in FIG. 1A, gate stacks including gate stacks 102A and 102B are formed over the semiconductor substrate 100, in accordance with some embodiments. In some embodiments, channel regions 101A and 101B are formed or defined under the gate stacks 102A and 102B, as shown in FIG. 1A. The channel regions 101A and 101B may be used to provide connecting path for carriers between the subsequently formed source/drain structures.

In some embodiments, each of the gate stacks 102A and 102B includes a gate dielectric layer 104 and a gate electrode 106. In some embodiments, each of the gate stacks 102A and 102B further includes a hard mask 108 on the gate electrode 106. The hard mask 108 may serve as an etching mask during the formation of the gate electrode 106. The hard mask 108 may also protect the gate electrode 106 during subsequent processes. In some embodiments, the hard mask 108 is made of silicon nitride, silicon oxynitride, silicon carbide, silicon oxide, silicon carbon nitride, another suitable material, or a combination thereof.

In some embodiments, the gate electrode 106 includes polysilicon, a metal material, another suitable conductive material, or a combination thereof. In some embodiments, the gate electrode 106 is a dummy gate electrode and will be replaced with another conductive material, such as a metal material. The dummy gate electrode layer is made of, for example, polysilicon.

In some embodiments, the gate dielectric layer 104 is made of silicon oxide, silicon nitride, silicon oxynitride, dielectric material with high dielectric constant (high-K), another suitable dielectric material, or a combination thereof. Examples of high-K dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, another suitable high-K material, or a combination thereof. In some embodiments, the gate dielectric layer 104 is a dummy gate dielectric layer which will be removed in a subsequent gate replacement process. The dummy gate dielectric layer is, for example, a silicon oxide layer.

In some embodiments, a gate dielectric material layer, a gate electrode layer, and a hard mask layer are deposited over the semiconductor substrate 100. Each of the gate dielectric material layer, the gate electrode layer, and the hard mask layer may be deposited using a chemical vapor deposition (CVD) process, an atomic layer deposition (ALD) process, a physical vapor deposition (PVD) process, another applicable process, or a combination thereof. Afterwards, a photolithography process and an etching process are performed to pattern the hard mask layer so as to form the hard mask 108. The gate dielectric material layer and the gate electrode layer are etched afterwards through openings defined by the hard mask 108. As a result, multiple gate stacks including the gate stacks 102A and 106B are formed.

In some embodiments, sealing elements 109 are formed over sidewalls of the gate stacks 102A and 102B, as shown in FIG. 1A. The sealing elements 109 may be used to protect the gate electrodes 106. The sealing elements 109 may also be used to assist in the formation of lightly doped source and drain (LDS/D) regions (not shown). In some embodiments, an ion implantation process is used to implant suitable dopants into the semiconductor substrate 100 with the gate stacks 102A and 102B and the sealing elements 109 as a mask. As a result, the LDS/D regions are formed.

The sealing elements 109 may be made of silicon oxide, silicon oxynitride, silicon nitride, silicon carbide, silicon carbon nitride, another suitable material, or a combination thereof. In some embodiments, a sealing material layer is deposited over the semiconductor substrate 100 and the gate stacks 102A and 102B. Afterwards, an etching process, such as an anisotropic etching process, is performed to partially remove the sealing material layer. As a result, the remaining portions of the sealing material layer form the sealing elements 109, as shown in FIG. 1A.

In some embodiments, spacer elements 110 are formed over the sealing elements 109, as shown in FIG. 1A. The spacer elements 110 may be made of silicon nitride, silicon oxynitride, silicon carbide, silicon carbon nitride, another suitable material, or a combination thereof. In some embodiments, a spacer material layer is deposited over the semiconductor substrate 100, the gate stacks 102A and 102B, and the sealing elements 109. Afterwards, an etching process, such as an anisotropic etching process, is performed to partially remove the spacer material layer. As a result, the remaining portions of the spacer material layer form the spacer elements 110, as shown in FIG. 1A.

Figure 1B:
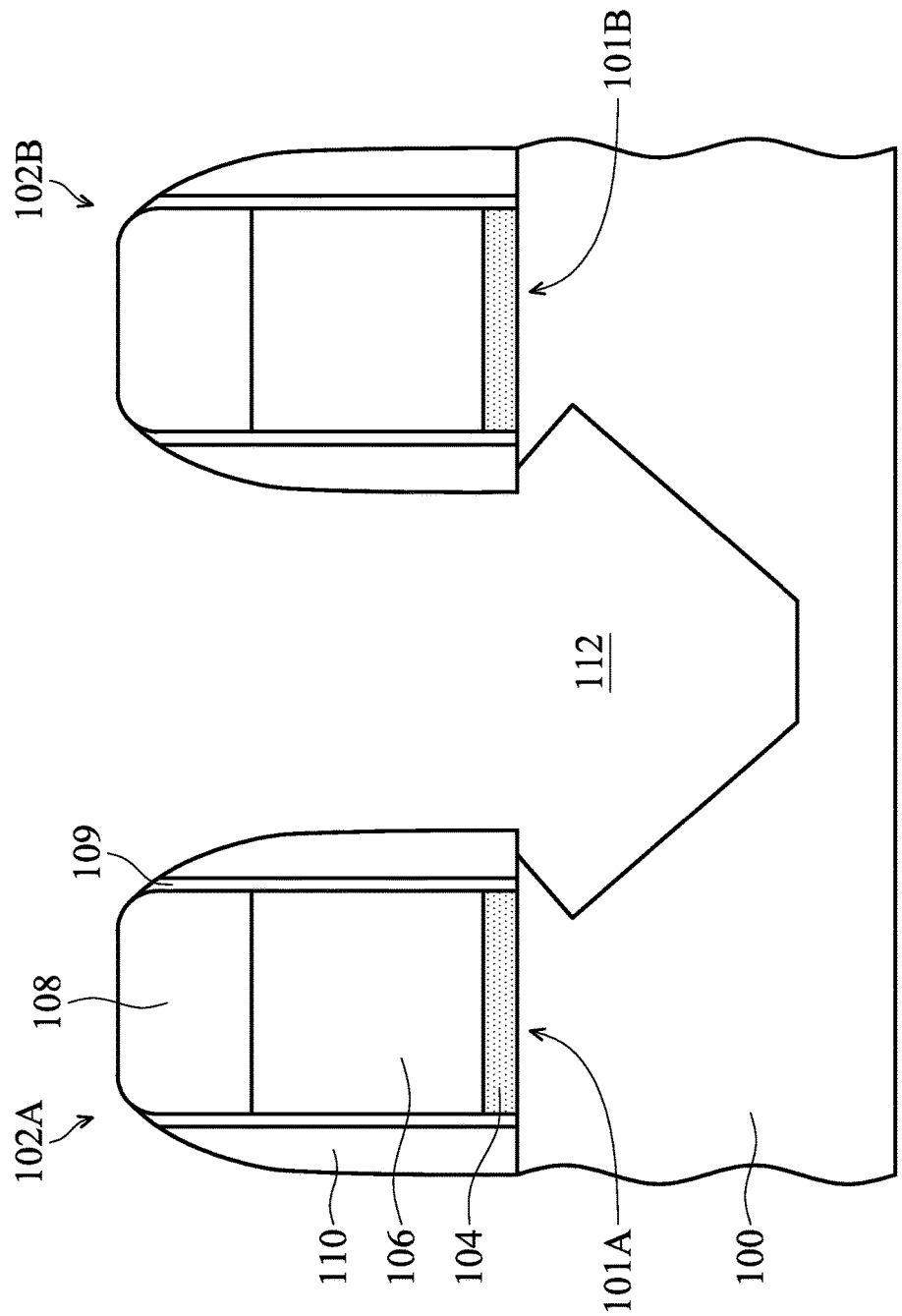

As shown in FIG. 1B, recesses including a recess 112 are formed in the semiconductor substrate 100, in accordance with some embodiments. The recesses including the recess 112 are used to contain source/drain structures that will be formed afterwards. In some embodiments, the recess 112 is in the semiconductor substrate 100 and adjacent to the channel regions 101A and 101B respectively under the gate stacks 102A and 102B. In some embodiments, the recess 112 extends laterally under a corresponding channel region of the corresponding gate stack, as shown in FIG. 1B. In some embodiments, the recess 112 has "V-shaped" sidewalls.

In some embodiments, one or more etching operations are used to form the recess 112. The gate stacks 102A and 102B and the spacer elements 110 may together serve as an etching mask during the formation of the recess 112. In some embodiments, the formation of the recess 112 includes performing an anisotropic etching to etch into the semiconductor substrate 100. Afterwards, a wet etching is performed by dipping the semiconductor substrate 100 into an etching solution or applying an etching solution on the semiconductor substrate 100 so as to laterally expand the recess. As a result, the recess 112 is formed, as shown in FIG. 1B.

Figure 1C:
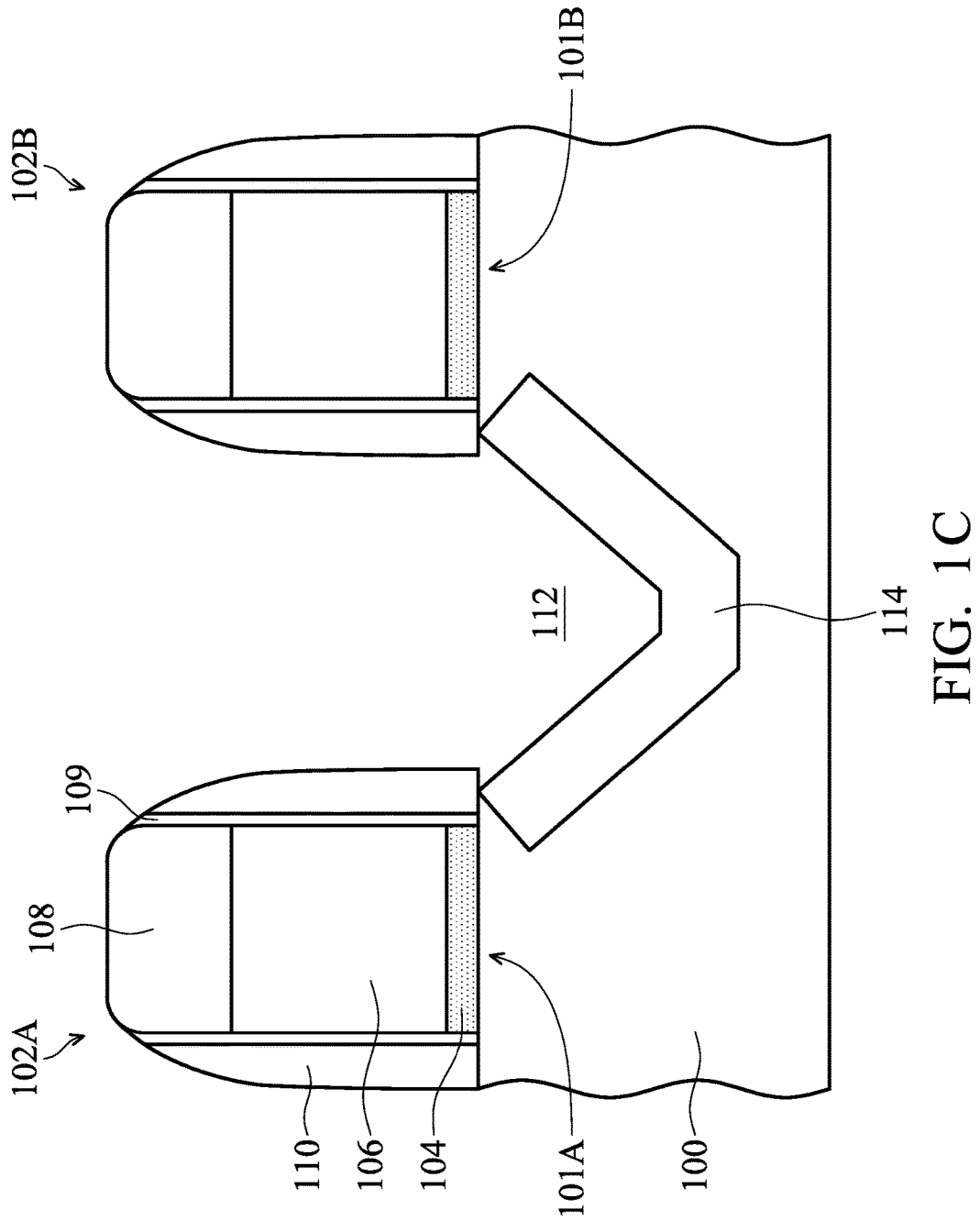

As shown in FIG. 1C, a first semiconductor layer 114 is deposited in the recess 112, in accordance with some embodiments. In some embodiments, the first semiconductor layer 114 is in direct contact with the semiconductor substrate 100. In some embodiments, the first semiconductor layer 114 includes a first element and a second element. In some embodiments, the first element is silicon. In some embodiments, the atomic radius of the second element is greater than that of the first element. In some embodiments, the second element is germanium. In some embodiments, the first semiconductor layer 114 is made of silicon germanium. In some embodiments, the atomic concentration of germanium in the first semiconductor layer 114 is in a range from about 10% to about 35%. In some other embodiments, the atomic concentration of germanium in the first semiconductor layer 114 is in a range from about 15% to about 30%. In some embodiments, the semiconductor layer 114 is not doped with a dopant such as boron.

In some embodiments, the atomic concentration of germanium in the first semiconductor layer 114 gradually increases along a direction from a lower portion towards an upper portion of the first semiconductor layer 114. In some embodiments, the atomic concentration of germanium near an interface between the first semiconductor layer 114 and the semiconductor substrate 100 is in a range from about 15% to about 20%. In some embodiments, the atomic concentration of germanium gradually increases along a direction away from the interface between the first semiconductor layer 114 and the semiconductor substrate 100. In some embodiments, the atomic concentration of germanium near the top surface of the first semiconductor layer 114 is in a range from about 25% to about 35%.

In some embodiments, the first semiconductor layer 114 is epitaxially grown on the surface of the semiconductor substrate 100 that is exposed by the recess 112. In some embodiments, the first semiconductor layer 114 is formed using a selective epitaxial growth (SEG) process, a CVD process (e.g., a vapor-phase epitaxy (VPE) process, a low pressure chemical vapor deposition (LPCVD) process, and/or an ultra-high vacuum CVD (UHV-CVD) process), a molecular beam epitaxy process, another applicable process, or a combination thereof.

In some embodiments, the first semiconductor layer 114 is formed using a gas mixture. In some embodiments, a silicon-containing gas and a germanium-containing gas are used to epitaxially grow the first semiconductor layer 114. In some embodiments, the silicon-containing gas includes dichlorosilane (DCS), silane ($SiH_4$), methylsilane ($SiCH_6$), another suitable gas, or a combination thereof. In some embodiments, the germanium-containing gas includes germane ($GeH_4$), another suitable gas, or a combination thereof. In some embodiments, the flow rate of the germanium-containing gas is gradually increased during the growth of the first semiconductor layer 114. As a result, the first semiconductor layer 114 with a gradually increased atomic concentration of germanium is formed.

Figure 1D:
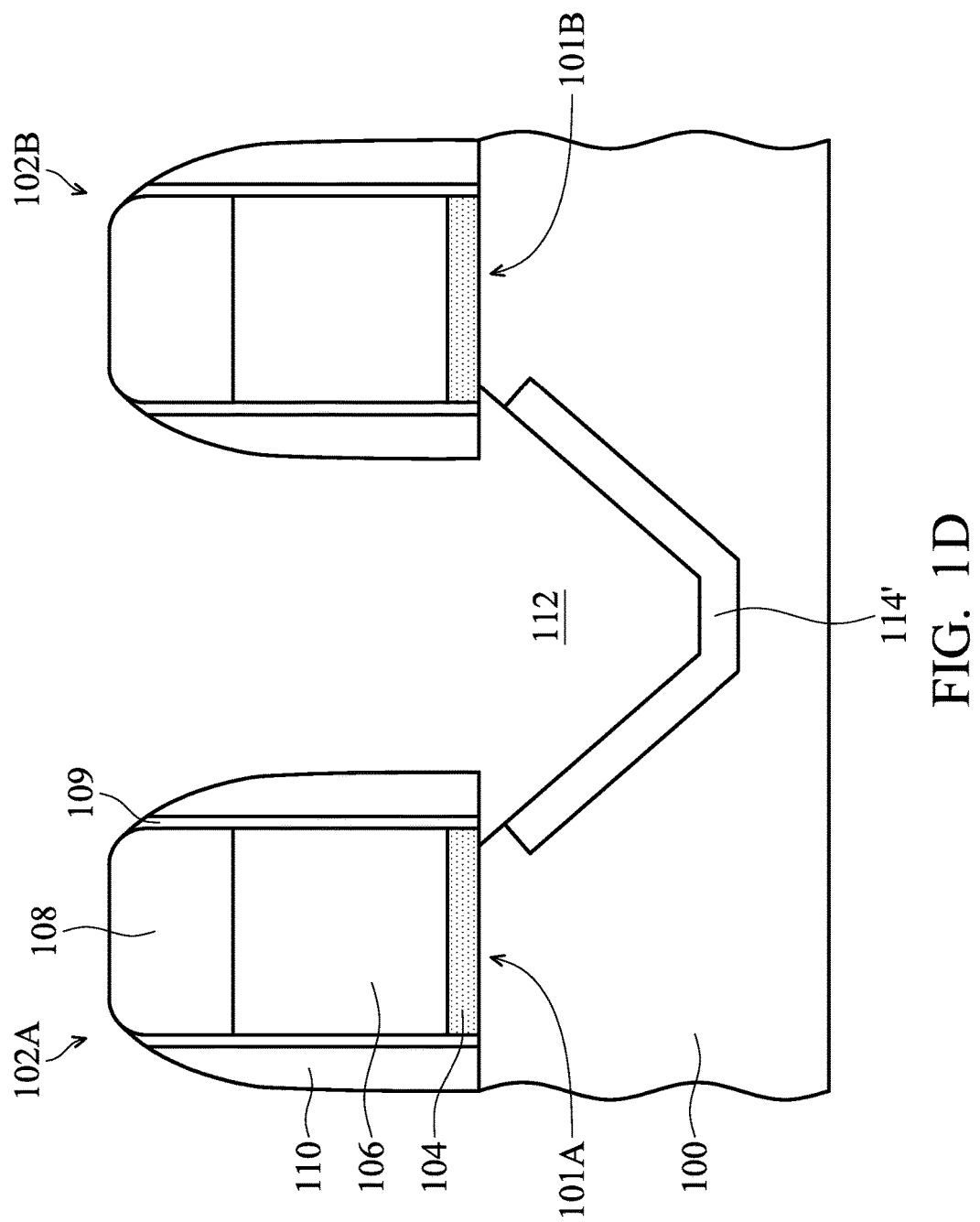

As shown in FIG. 1D, the first semiconductor layer 114 is partially removed, in accordance with some embodiments. As shown in FIG. 1D, the first semiconductor layer, that is partially removed, is now denoted by the reference number 114'. In some embodiments, an etching process is used to etch back the first semiconductor layer 114. In some embodiments, a portion of the semiconductor substrate 100 is also removed. In some embodiments, the semiconductor substrate 100 is partially removed during the etching process for partially removing the first semiconductor layer 114. In other words, the partial removal of the semiconductor substrate 100 occurs during the partial removal of the first semiconductor layer 114.

After the etching process, the recess 112 extends further towards the channel regions 101A and 101B, as shown in FIG. 1D in accordance with some embodiments. The recess 112 exposes a portion of the semiconductor substrate 100, as shown in FIG. 1D. Because the recess 122 extends further towards the channel region 101A and/or the channel region 101B, a subsequently formed stressor may provide more effective stress in the channel region 101A and/or the channel region 101B. The subsequently formed stressor includes, for example, a source/drain stressor structure. Because the first semiconductor layer 114 and the semiconductor substrate 100 are partially removed, space is created for a subsequently formed second semiconductor layer that will be described later.

Figure 2:
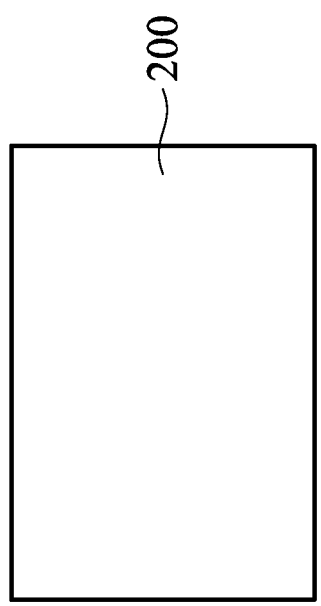
FIG. 2 is a cross-sectional view of a process chamber used for forming a semiconductor device structure, in accordance with some embodiments.

In some embodiments, the first semiconductor layer 114 and the semiconductor substrate 100 are partially removed using an etching process such as a dry etching process. FIG. 2 is a cross-sectional view of a process chamber 200 used for forming a semiconductor device structure, in accordance with some embodiments. In some embodiments, the first semiconductor layer 114 is epitaxially grown in the process chamber 200. In some embodiments, the etching process is also performed in the process chamber 200 where the growth of the first semiconductor layer 114 is performed. In some embodiments, the formation of the first semiconductor layer 114 and the partial removal of the first semiconductor layer 114 and the semiconductor substrate 100 are performed in-situ in the process chamber 200. Therefore, the semiconductor device structure is prevented from being contaminated, thus ensuring the quality of the finished product.

In some embodiments, a halogen-containing gas is used in the etching process. In some embodiments, the halogen-containing gas includes one (or more) chlorine-containing gas. The chlorine-containing gas includes, for example, hydrogen chloride gas. In some embodiments, the operation temperature of the etching process is in a range from about 400 degrees C. to about 700 degrees C. In some other embodiments, the operation temperature is in a range from about 500 degrees C. to about 600 degrees C. Due to the high operation temperature, the semiconductor substrate 100 is also partially removed during the etching process.

Figure 1E:
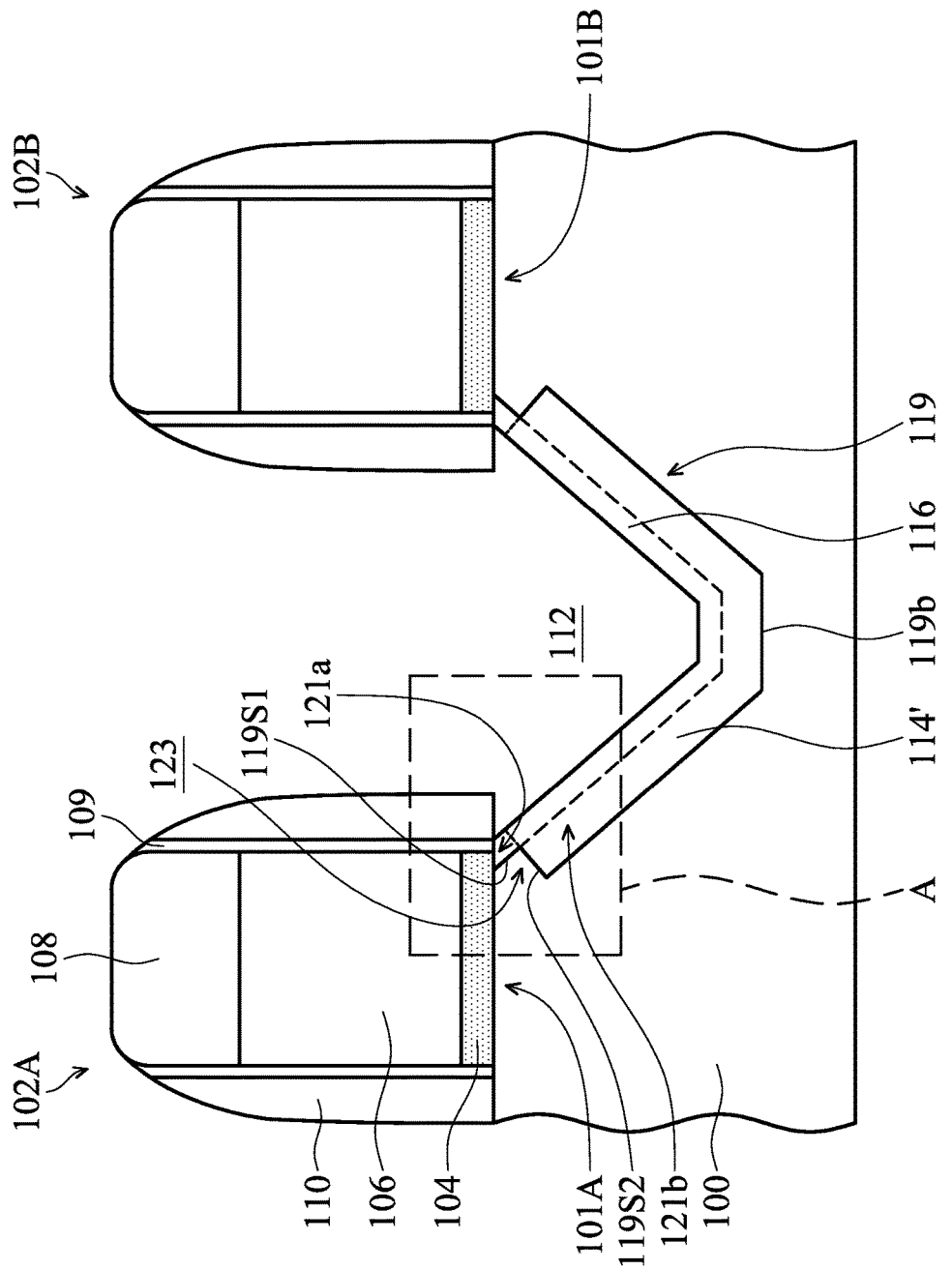

As shown in FIG. 1E, a second semiconductor layer 116 is deposited over the semiconductor layer 114' and the exposed surface of the semiconductor substrate 100 in the recess 112, in accordance with some embodiments. As mentioned above, after the partial removal of the semiconductor layer 114 and the semiconductor substrate 100, the space is created, which allows the second semiconductor layer 116 to be formed to cover and protect the channel regions 101A and 101B.

In some embodiments, the second semiconductor layer 116 is in direct contact with the semiconductor layer 114'. In some embodiments, the second semiconductor layer 116 is in direct contact with the semiconductor substrate 100. In some embodiments, the second semiconductor layer 116 is in direct contact with the channel region 101A and/or the channel region 101B.

In some embodiments, similar to the semiconductor layer 114', the second semiconductor layer 116 also includes a first element and a second element. As mentioned above, the atomic radius of the second element is greater than that of the first element. In some embodiments, the second semiconductor layer 116 is made of silicon germanium. In some embodiments, the atomic concentration of germanium in the second semiconductor layer 116 is in a range from about 15% to about 35%. In some other embodiments, the atomic concentration of germanium in the second semiconductor layer 116 is in a range from about 20% to about 30%.

In some embodiments, the atomic concentration of germanium in the second semiconductor layer 116 gradually increases along a direction from a lower portion towards an upper portion of the second semiconductor layer 116. In some embodiments, the atomic concentration of germanium near an interface between the second semiconductor layer 116 and the semiconductor layer 114' is in a range from about 15% to about 20%. In some embodiments, the atomic concentration of germanium gradually increases along a direction away from the interface between the second semiconductor layer 116 and the semiconductor layer 114'. In some embodiments, the atomic concentration of germanium near the top surface of the second semiconductor layer 116 is in a range from about 25% to about 35%.

In some embodiments, the second semiconductor layer 116 is epitaxially grown on the surfaces of the semiconductor layer 114' and the semiconductor substrate 100 that are exposed by the recess 112. In some embodiments, the second semiconductor layer 116 is formed using a selective epitaxial growth (SEG) process, a CVD process (e.g., a vapor-phase epitaxy (VPE) process, a low pressure chemical vapor deposition (LPCVD) process, and/or an ultra-high vacuum CVD (UHV-CVD) process), a molecular beam epitaxy process, another applicable process, or a combination thereof. In some embodiments, the second semiconductor layer 116 is formed in the process chamber 200 where the growth of the first semiconductor layer 114 is performed. Therefore, the semiconductor device structure is prevented from being contaminated, thus ensuring the quality of the finished product.

In some embodiments, the second semiconductor layer 116 is formed using a gas mixture. In some embodiments, a silicon-containing gas and a germanium-containing gas are used to epitaxially grow the second semiconductor layer 116. In some embodiments, the silicon-containing gas includes dichlorosilane (DCS), silane ($SiH_4$), methylsilane ($SiCH_6$), another suitable gas, or a combination thereof. In some embodiments, the germanium-containing gas includes germane ($GeH_4$), another suitable gas, or a combination thereof. In some embodiments, the flow rate of the germanium-containing gas is gradually increased during the growth of the second semiconductor layer 116. As a result, the second semiconductor layer 116 with a gradually increased atomic concentration of germanium is formed.

As shown in FIG. 1E, the semiconductor layer 114' and the second semiconductor layer 116 together form a semiconductor layer 119 (or semiconductor protection layer), in accordance with some embodiments. The semiconductor layer 119 is configured to prevent dopants in a source/drain structure that will be formed in the recess 112 from entering the channel region 101A. In some embodiments, the interface between the semiconductor layer 114' and the second semiconductor layer 116 can be observed using an electron microscope. In some other embodiments, the interface between the semiconductor layer 114' and the second semiconductor layer 116 cannot be observed using an electron microscope. In these cases, the interface between the semiconductor layer 114' and the second semiconductor layer 116 is illustrated using a dotted line.

Figure 3:
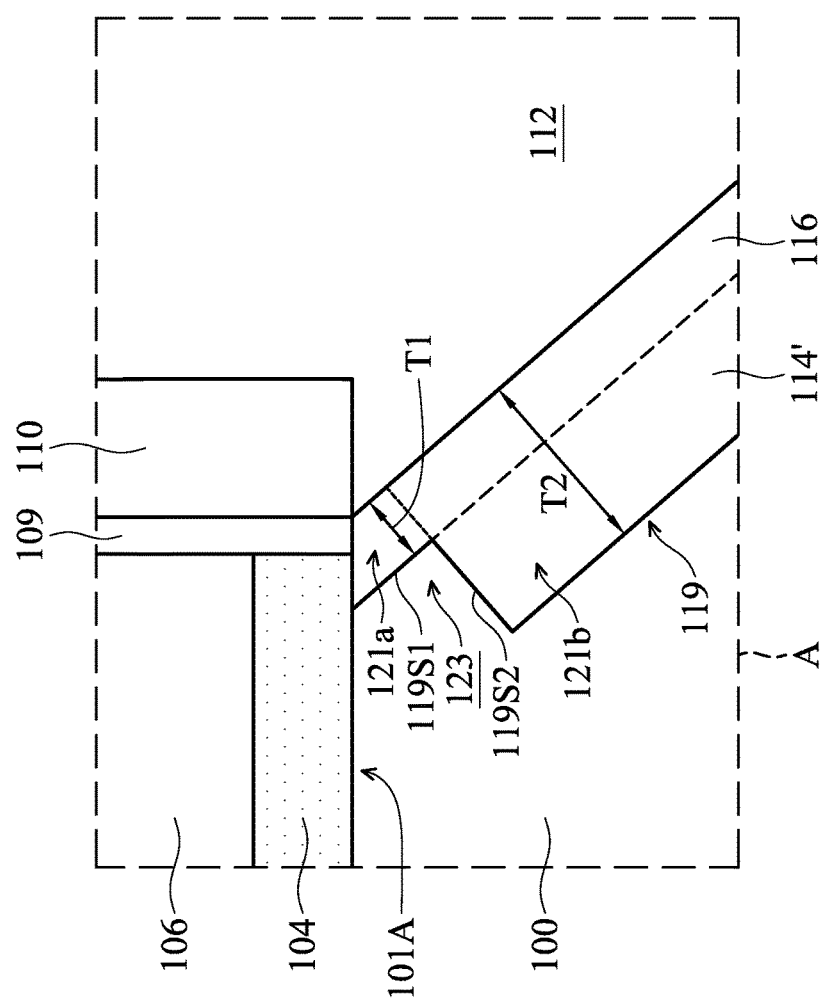
FIG. 3 is a cross-sectional views of a semiconductor device structure, in accordance with some embodiments.

As shown in FIG. 1E, the semiconductor layer 119 has a first portion 121a and a second portion 121b. FIG. 3 is enlarged cross-sectional views of a semiconductor device structure, in accordance with some embodiments. In some embodiments, FIG. 3 shows an enlarged cross-sectional view of the region A shown in FIG. 1E. In some embodiments, the first portion 121a has a thickness $T_1$ that is greater than a thickness $T_2$ of the second portion 121b, as shown in FIG. 3. In some embodiments, the thickness $T_1$ is in a range from about 1 nm to about 3 nm. In some embodiments, the thickness $T_2$ is in a range from about 5 nm to about 10 nm. In some embodiments, a ratio of the thickness $T_1$ to the thickness $T_2$ ($T_1/T_2$) is in a range from about 0.1 to about 0.6. In some other embodiments, the ratio ($T_1/T_2$) is in a range from about 0.1 to about 0.3.

In some embodiments, the first portion 121a is in direct contact with the channel region 101A. In some embodiments, the atomic concentration of the second element, such as germanium, in the first portion 121a is greater than the atomic concentration of the second element, such as germanium, in the second portion 121b. In some embodiments, the atomic concentration of the second element, such as germanium, in the semiconductor layer 119 gradually increases along a direction from a bottom 119b of the semiconductor layer 119 towards the top surface of the semiconductor layer 119.

As shown in FIGS. 1E and 3, the semiconductor layer 119 has a recess 123 facing the channel region 101A, in accordance with some embodiments. In some embodiments, the recess 123 is adjacent to the gate stack 102A. In some embodiment, the recess 123 has "V-shaped" sidewalls or a "V-shaped" or "V-shaped like" profile. In some embodiments, a surface $119S_1$ of the first portion 121a forms a first sidewall of the recess 123, and a surface $119S_2$ of the second portion 121b forms a second sidewall of the recess 123.

Figure 1F:
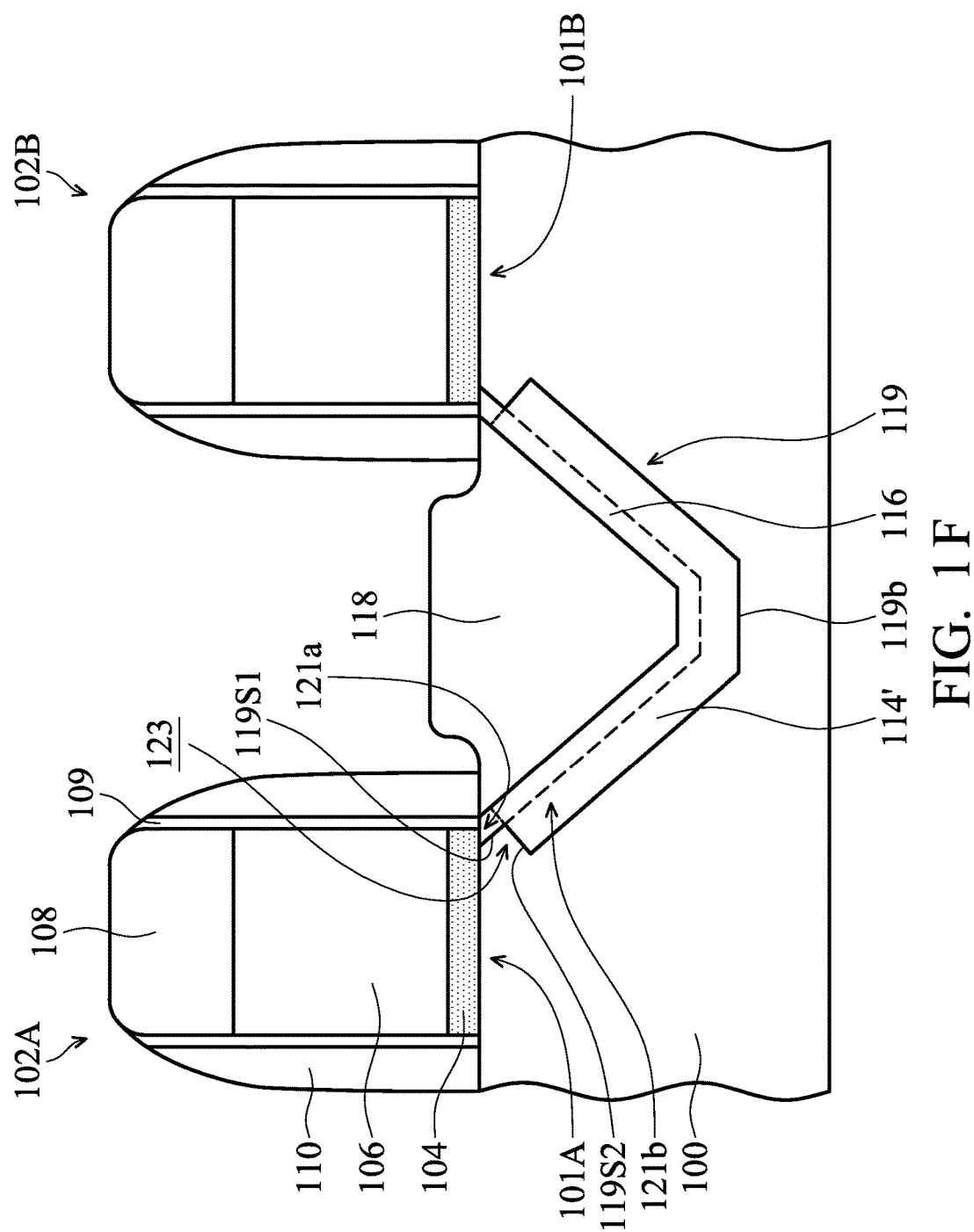

As shown in FIG. 1F, a source/drain (source or drain structure) structure 118 is formed over the second semiconductor layer 116, in accordance with some embodiments. In some embodiments, the source/drain structure 118 protrudes above the semiconductor substrate 100. The source/drain structure 118 may be used as stressors for providing stress or strain to the channel regions 101A and/or 101B so as to increase the carrier mobility. In some embodiments, the semiconductor layer 119 also functions as a stressor that assists in increasing the carrier mobility. In some embodiments, the semiconductor layer 119 surrounds the source/drain structure 118 and is used to prevent dopants in the source/drain structure 118 from diffusing into the channel region 101A.

In some embodiments, the source/drain structure 118 is a p-type region. For example, the source/drain structure 118 may include epitaxially grown silicon germanium doped with a p-type dopant such as boron. In some embodiments, the atomic concentration of the second element, such as germanium, in the source/drain structure 118 is greater than the atomic concentration of the second element, such as germanium, in the semiconductor layer 119. In some embodiments, the atomic concentration of germanium in the source/drain structure 118 is in a range from about 30% to about 50%. In some other embodiments, the atomic concentration of germanium in the source/drain structure 118 is in a range from about 35% to about 45%.

In some embodiments, the atomic concentration of germanium in the source/drain structure 118 gradually increases along a direction from a lower portion towards an upper portion of the source/drain structure 118. In some embodiments, the atomic concentration of germanium near an interface between the second semiconductor layer 116 and the source/drain structure 118 is in a range from about 30% to about 35%. In some embodiments, the atomic concentration of germanium gradually increases along a direction away from the interface between the second semiconductor layer 116 and the source/drain structure 118. In some embodiments, the atomic concentration of germanium near the top surface of the source/drain structure 118 is in a range from about 45% to about 50%.

In some embodiments, the source/drain structure 118 is epitaxially grown on the surfaces of the second semiconductor layer 116 that is exposed by the recess 112. In some embodiments, the source/drain structure 118 is formed using a selective epitaxial growth (SEG) process, a CVD process (e.g., a vapor-phase epitaxy (VPE) process, a low pressure chemical vapor deposition (LPCVD) process, and/or an ultra-high vacuum CVD (UHV-CVD) process), a molecular beam epitaxy process, another applicable process, or a combination thereof. In some embodiments, the source/drain structure 118 is formed in the process chamber 200 where the growth of the first semiconductor layer 114 and the second semiconductor layer 116 is performed.

In some embodiments, the source/drain structure 118 is formed using a gas mixture. In some embodiments, a silicon-containing gas and a germanium-containing gas are used to epitaxially grow the source/drain structure 118. In some embodiments, the silicon-containing gas includes dichlorosilane (DCS), silane ($SiH_4$), methylsilane ($SiCH_6$), another suitable gas, or a combination thereof. In some embodiments, the germanium-containing gas includes germane ($GeH_4$) or another suitable gas. In some embodiments, the flow rate of the germanium-containing gas is gradually increased during the growth of the source/drain structure 118. As a result, the source/drain structure 118 with a gradually increased atomic concentration of germanium is formed.

In some embodiments, the source/drain structure 118 is doped with one or more suitable dopants. For example, the source/drain structure 118 is a SiGe source/drain feature doped with boron (B) or another suitable dopant. In some embodiments, the source/drain structure 118 is doped in-situ during the epitaxial growth for forming the source/drain structure 118.

In some embodiments, the semiconductor layer 114' and the second semiconductor layer 116 are substantially free of the dopant (such as boron) in the source/drain structure 118. In other words, the semiconductor layer 119 does not include the dopant. In some other embodiments, the semiconductor layer 119 includes only a trace amount of the dopant (such as boron) when compared with the amount of dopant in the source/drain structure 118.

In some embodiments, the second semiconductor layer 116 separates the channel region 101A (or 101B) from the source/drain structure 118. In some embodiments, the first portion 121a of the semiconductor layer 119 separates the channel region 101A from the source/drain structure 118. In some embodiments, the first portion 121a of the semiconductor layer 119 is in direct contact with the source/drain structure 118. In some embodiments, the first portion 121a of the semiconductor layer 119 is in direct contact with both of the source/drain structure 118 and the channel region 101A.

In some embodiments, the second semiconductor layer 116 prevents the dopant (such as boron) in the source/drain structure 118 from diffusing into the channel region 101A and/or 101B. The dopant, such as boron, in the source/drain structure 118 is blocked from entering the channel region 101A. Due to the protection of the first portion 121a of the semiconductor layer 119, a higher concentration of the dopant can be implanted into the source/drain structure 118. The recess 112 may extend further towards the channel region 101A or 101B. More strain may be provided to the channel region 101A or 101B. The performance of the semiconductor device structure is therefore improved.

Figure 1G:
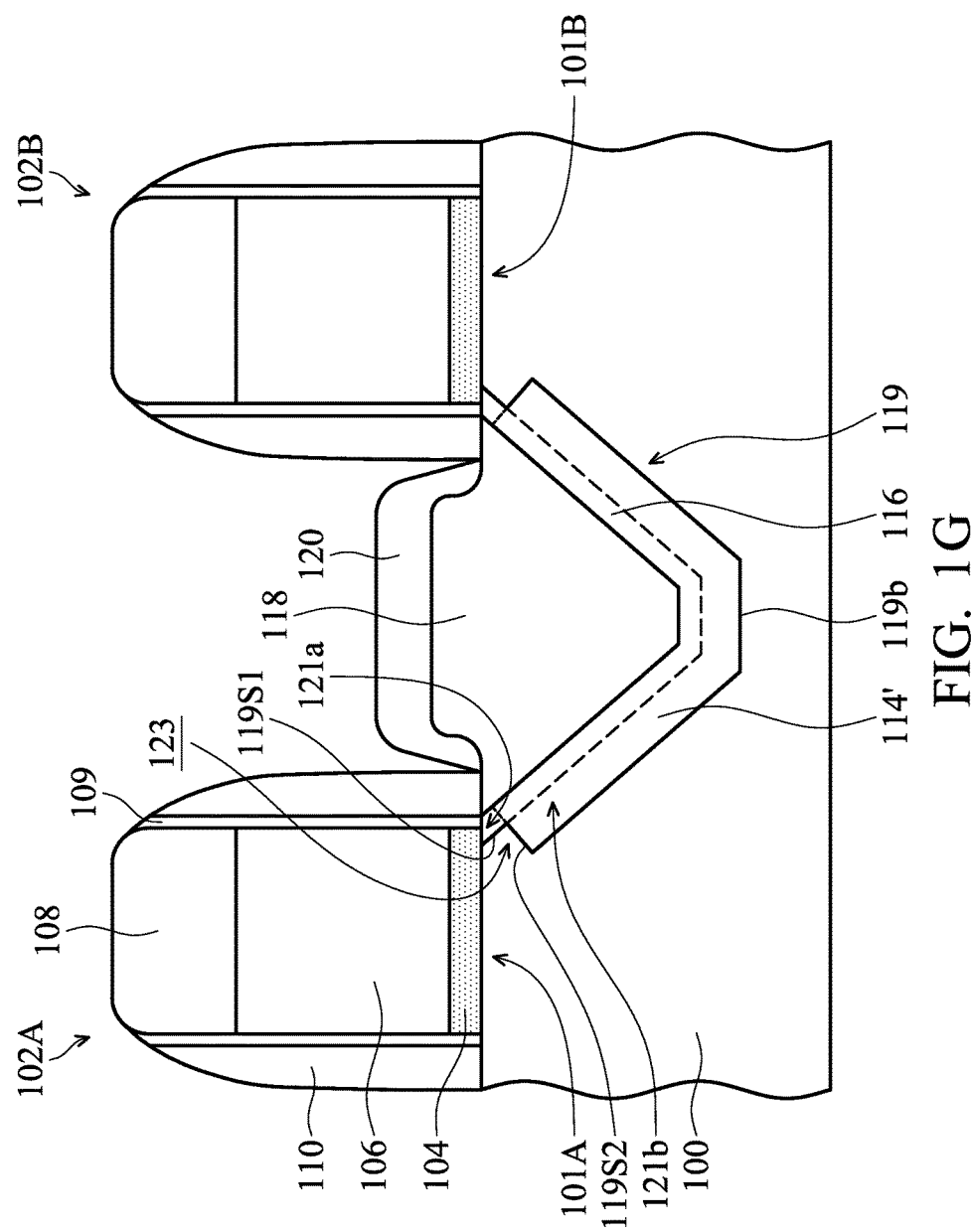

As shown in FIG. 1G, a cap element 120 is formed over the source/drain structure 118, in accordance with some embodiments. The cap element 120 may be used to protect the source/drain structure 118 thereunder. The cap element 120 may also be used for forming metal silicide features to enhance electrical connection between the source/drain structures and other conductive elements. In some embodiments, the source/drain structure 118 is in direct contact with the cap element 120.

In some embodiments, the cap element 120 includes silicon, silicon germanium, or a combination thereof. In some embodiments, the cap element 120 contains substantially no germanium. In some embodiments, the cap element 120 is made of substantially pure silicon.

In some embodiments, the cap element 120 is formed using a selective epitaxial growth (SEG) process, a CVD process (e.g., a vapor-phase epitaxy (VPE) process, a low pressure chemical vapor deposition (LPCVD) process, and/or an ultra-high vacuum CVD (UHV-CVD) process), a molecular beam epitaxy process, another applicable process, or a combination thereof. In some embodiments, the cap element 120 is formed in-situ in the same process chamber 200 where the source/drain structure 118 is grown.

Embodiments of the disclosure form a semiconductor layer between a source/drain stressor structure and a channel region to prevent dopants in the source/drain stressor structure from entering the channel region. Due to the protection of the semiconductor layer, a higher concentration of the dopant is allowed to be implanted into the source/drain stressor structure. The source/drain stressor structure may extend further towards the channel region to provide more strain to the channel region. The performance of the semiconductor device structure is therefore improved.

In accordance with some embodiments, a semiconductor device structure is provided. The semiconductor device structure includes a gate stack over a semiconductor substrate. The semiconductor device structure also includes a source/drain structure over the semiconductor substrate, and the source/drain structure includes a dopant. The semiconductor device structure further includes a channel region under the gate stack. In addition, the semiconductor device structure includes a semiconductor layer surrounding the source/drain structure. The semiconductor layer is configured to prevent the dopant from entering the channel region.

In accordance with some embodiments, a semiconductor device structure is provided. The semiconductor device structure includes a gate stack over a semiconductor substrate. The semiconductor device structure also includes a source/drain structure over the semiconductor substrate. The semiconductor device structure further includes a channel region under the gate stack. In addition, the semiconductor device structure includes a semiconductor layer between the source/drain structure and the semiconductor substrate. The semiconductor layer has a recess facing the channel region.

In accordance with some embodiments, a method for forming a semiconductor device structure is provided. The method includes forming a gate stack over a semiconductor substrate and forming a recess in the semiconductor substrate. The method also includes forming a first semiconductor layer in the recess and partially removing the first semiconductor layer. The method further includes partially removing the semiconductor substrate so that the recess extends laterally towards a channel region under the gate stack. In addition, the method includes forming a second semiconductor layer in the recess after the partial removal of the first semiconductor layer and the semiconductor substrate. The method also includes forming a source/drain structure over the second semiconductor layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
a gate stack over a semiconductor substrate;
a source/drain structure over the semiconductor substrate, wherein the source/drain structure comprises a dopant;
a channel region under the gate stack; and
a semiconductor layer surrounding the source/drain structure, wherein the semiconductor layer is contiguous from a top surface of the semiconductor substrate to under the source/drain structure, and wherein the semiconductor layer has a recess facing the channel region, wherein the recess is defined by:

a first sidewall of a first portion of the semiconductor layer, wherein the first sidewall extends from interfacing the gate stack to a first depth in the semiconductor substrate and wherein the first sidewall is disposed oblique to a top surface of the semiconductor substrate; and a second sidewall of a second portion of the semiconductor layer under the first portion of the semiconductor layer, wherein the second sidewall extends from the first sidewall at the first depth to a second depth in the semiconductor substrate, wherein the first and second sidewalls forming a V-shape having an opening facing the channel region, and wherein the second depth is further from the top surface of the semiconductor substrate than the first depth.

2. The semiconductor device structure as claimed in claim 1, wherein the semiconductor layer separates the channel region from the source/drain structure, and is substantially free of a dopant that is found in the source/drain structure.

3. The semiconductor device structure as claimed in claim 1, wherein each of the semiconductor layer and the source/drain structure comprises a first element and a second element.

4. The semiconductor device structure as claimed in claim 3, wherein the first element is silicon, and the second element is germanium.

5. The semiconductor device structure as claimed in claim 3, wherein an atomic concentration of the second element in the source/drain structure is greater than an atomic concentration of the second element in the semiconductor layer.

6. The semiconductor device structure as claimed in claim 3, wherein the atomic concentration of the second element in the semiconductor layer gradually increases along a direction from the first sidewall of the first portion of the semiconductor layer towards the source/drain structure, and wherein a third portion of the semiconductor layer directly underlying the source/drain structure includes the atomic concentration of the second element increasing from a bottommost surface of the third portion of the semiconductor layer towards the source/drain structure.

7. A semiconductor device structure, comprising:
a gate stack over a semiconductor substrate, wherein the gate stack includes a gate dielectric layer and a gate electrode over the gate dielectric layer;
a source/drain structure over the semiconductor substrate, wherein the source/drain structure comprises a dopant;
a channel region under the gate stack; and
a semiconductor layer between the source/drain structure and the semiconductor substrate, wherein the semiconductor layer has a recess facing the channel region, the recess defined by a sidewall of a first portion of the semiconductor layer and a sidewall of a second portion of the semiconductor layer, and the first portion and the second portion of the semiconductor layer are contiguous and each is substantially free of the dopant, wherein the semiconductor layer includes:
the first portion having a first thickness, wherein the first thickness is defined as distance between an interface with the source/drain structure to an interface with the channel region, wherein the first portion of the semiconductor layer physically contacts the gate dielectric layer of the gate stack;
the second portion of the semiconductor layer underlying the first portion and extending under the source/drain structure, wherein the second portion has a second thickness, wherein the second thickness is defined as distance between an interface with the source/drain structure to an interface with the channel region, and wherein the second thickness is greater than the first thickness and wherein the second portion of the semiconductor layer includes silicon germanium having an increasing atomic percentage of germanium from the interface with the channel region to the interface with the source/drain structure.

8. The semiconductor device structure as claimed in claim 7, wherein the recess is defined by sidewalls that form a V-shaped profile, wherein an opening of the V-shaped profile faces the channel region.

9. The semiconductor device structure as claimed in claim 8, wherein an atomic concentration of germanium in the first portion is greater than at least one atomic concentration of germanium of the increasing atomic concentration of germanium in the second portion.

10. The semiconductor device structure of claim 1, wherein the first portion of the semiconductor layer interfaces a dielectric layer of the gate stack.

11. The semiconductor device structure of claim 1, wherein a third sidewall of the second portion of the semiconductor layer extends from the second sidewall, wherein the third sidewall is parallel to the first sidewall and spaced a lateral distance toward the channel region from the first sidewall.

12. The semiconductor device structure of claim 1, the second portion of the semiconductor layer having a third sidewall extending from an interface with the second sidewall at the second depth to extend under the source/drain structure, wherein a length of the third sidewall from the second depth to under the source/drain structure is linear.

13. A semiconductor device structure, comprising:
a gate stack over a semiconductor substrate;
a source/drain structure over the semiconductor substrate, wherein the source/drain structure comprises a dopant;
a channel region under the gate stack; and
a semiconductor layer between the source/drain structure and the semiconductor substrate, wherein the semiconductor layer includes:
a first portion of silicon germanium having a first thickness; and
a second portion of silicon germanium having a second thickness, being contiguous with the first portion, and extending under the source/drain structure, wherein the second thickness is greater than the first thickness, the first and second portions are each substantially free of the dopant;
wherein the semiconductor layer including the second portion includes silicon germanium with an increasing atomic percentage of germanium from a surface interfacing the semiconductor substrate to an interface with the source/drain structure; and
wherein the semiconductor layer has a recess facing the channel region, the recess defined by a sidewall of the first portion of the semiconductor layer and a sidewall of the second portion of the semiconductor layer.

14. The semiconductor device structure of claim 13, wherein the second portion of silicon germanium includes the increasing atomic percentage of germanium from a bottommost surface of the second portion to an interface between the second portion and a bottommost surface of the source/drain structure.

15. The semiconductor device structure of claim 13, wherein the dopant is boron and the source/drain structure is a p-type region including the dopant.

16. The semiconductor device structure of claim 13, wherein the semiconductor layer contiguously extends from a top surface of the semiconductor substrate on a first side of the source/drain structure, under the source/drain structure and to the top surface of the semiconductor substrate on a second side of the source/drain structure.

17. The semiconductor device structure of claim 16, further comprising: another gate structure on the second side of the source/drain structure, wherein the semiconductor layer extends from an interface with a layer of the gate stack to an interface with a layer of the another gate structure.

18. The semiconductor device structure as claimed in claim 11,
   wherein the second portion is thicker than the first portion, and wherein the thickness is measured from an interface with the source/drain structure to the respective of the first sidewall and the third sidewall.

19. The semiconductor device structure as claimed in claim 18, wherein the first portion of the semiconductor layer is in direct contact with the source/drain structure, a dielectric layer of the gate stack, and the channel region.

20. The semiconductor device structure as claimed in claim 18, wherein an atomic concentration of germanium in the first portion is greater than an atomic concentration of germanium in a region of the second portion.

* * * * *